United States Patent
Jaffari

(10) Patent No.: US 9,100,017 B2
(45) Date of Patent: Aug. 4, 2015

(54) IMPEDANCE COMPONENT HAVING LOW SENSITIVITY TO POWER SUPPLY VARIATIONS

(71) Applicant: Samsung Display Co., Ltd., Yongin, Gyeonggi-Do (KR)

(72) Inventor: Nasrin Jaffari, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/180,265

(22) Filed: Feb. 13, 2014

(65) Prior Publication Data

US 2015/0008965 A1    Jan. 8, 2015

Related U.S. Application Data

(60) Provisional application No. 61/843,897, filed on Jul. 8, 2013.

(51) Int. Cl.
| | |
|---|---|
| H03L 5/00 | (2006.01) |
| H03K 17/687 | (2006.01) |
| H03H 11/30 | (2006.01) |
| H03K 17/14 | (2006.01) |

(52) U.S. Cl.
CPC ............ *H03K 17/687* (2013.01); *H03H 11/30* (2013.01); *H03K 17/145* (2013.01); *H03K 2217/0081* (2013.01)

(58) Field of Classification Search
USPC .................. 327/308, 309, 315, 318, 331, 520
See application file for complete search history.

(56) References Cited

U.S. PATENT DOCUMENTS

| | | | |
|---|---|---|---|
| 4,706,035 A * | 11/1987 | Dijkmans et al. ............. 330/156 |
| 5,545,977 A | 8/1996 | Yamada et al. | |
| 5,663,673 A * | 9/1997 | Tanaka et al. ................. 327/412 |
| 5,774,014 A * | 6/1998 | Stecker et al. ................ 327/546 |
| 6,034,519 A | 3/2000 | Yang | |
| 2002/0008500 A1 | 1/2002 | Hashimoto | |
| 2006/0202668 A1 | 9/2006 | Tran et al. | |
| 2011/0031918 A1 | 2/2011 | Sugie | |
| 2012/0049954 A1 | 3/2012 | Wang et al. | |
| 2014/0104964 A1* | 4/2014 | Peng et al. ............... 365/189.09 |
| 2014/0285406 A1* | 9/2014 | Kimura et al. .................. 345/76 |

FOREIGN PATENT DOCUMENTS

| | | |
|---|---|---|
| KR | 10-0881995 | 11/2008 |
| KR | 10-1009348 | 1/2011 |
| KR | 10-2013-0072042 | 7/2013 |

OTHER PUBLICATIONS

EPO Search Report dated Dec. 3, 2014, for corresponding European Patent application 14176095.9, (11 pages).
*Dual 4-A Peak High-Speed Low-Side Power Mosfet Drivers*, Texas Instruments, Mar. 2009—Revised Apr. 2012, retrieved from the internet: URL:http://www.ti.com/lit/ds/sylink/ucc27324-ql.pdf, pp. 1-16, XP055153711.

* cited by examiner

*Primary Examiner* — William Hernandez
(74) *Attorney, Agent, or Firm* — Christie, Parker & Hale, LLP

(57) ABSTRACT

An impedance circuit coupled to a first power supply includes: an output node; a transistor coupled between the output node and the first power supply, wherein the transistor comprises a gate electrode; and a voltage source electrically coupled to the gate electrode of the transistor and configured to apply a gate voltage to the gate electrode of the transistor, wherein the voltage source includes: a plurality of impedance components electrically coupled in series between a circuit node and the first power supply, and a current source electrically coupled between the circuit node and a second power supply.

20 Claims, 9 Drawing Sheets

IMPEDANCE COMPONENT HAVING LOW SENSITIVITY TO POWER SUPPLY VARIATIONS

CROSS-REFERENCE TO RELATED APPLICATION

The present application claims priority to and the benefit of U.S. Provisional Application Ser. No. 61/843,897, filed Jul. 8, 2013, entitled "SUPPLY VARIATION INSENSITIVE CIRCUIT WITH MOSFET SWITCH," the entire content of which is incorporated herein by reference.

BACKGROUND

1. Field

The present invention is related to a system and method for providing an impedance component having a low sensitivity to power supply variations.

2. Description of Related Art

In various technologies, it is desirable to provide components that have a relatively stable impedance that can selectively couple nodes of an electronic circuit in response to a control voltage or control signal. The impedance of a switch (e.g. a MOSFET) utilized for such components to selectively couple nodes of the electronic circuit may tend to vary with variations in power supply voltages. Such sensitivities of the impedance to changes in power supply voltages may degrade or impair the function of electronic devices. Accordingly, there is a need for an electrical component having an impedance that is relatively insensitive to changes or variations in power supply voltages.

SUMMARY

Aspects of embodiments of the present invention provide a system and method for providing an impedance component having a low sensitivity to power supply variations.

According to one embodiment of the present invention, an impedance circuit is coupled to a first power supply, the impedance circuit including: an output node; a transistor coupled between the output node and the first power supply, wherein the transistor includes a gate electrode; and a voltage source electrically coupled to the gate electrode of the transistor and configured to apply a gate voltage to the gate electrode of the transistor, wherein the voltage source includes: a plurality of impedance components electrically coupled in series between a circuit node and the first power supply, and a current source electrically coupled between the circuit node and a second power supply.

A resistor may be electrically coupled between the transistor and the output node.

The impedance components may include a plurality of diode-connected transistors or a plurality of diodes.

The first power supply may be configured to provide a first voltage and the second power supply may be configured to provide a second voltage, wherein the first voltage is higher than the second voltage.

The first power supply may be configured to provide a first voltage and the second power supply may be configured to provide a second voltage, wherein the first voltage is lower than the second voltage.

The voltage source may further include a multiplexer, and the multiplexer may include a high voltage terminal and a low voltage terminal electrically coupled between the circuit node and the first power supply, wherein the multiplexer may be configured to selectively electrically couple the circuit node to the gate electrode of the transistor in response to a control signal voltage.

Each of the impedance components may be configured to have a uniform and constant voltage drop.

According to another embodiment of the present invention, an impedance circuit includes: a transistor includes a gate electrode; and a voltage source electrically coupled to the gate electrode of the transistor and configured to apply a gate voltage to the gate electrode of the transistor, wherein the voltage source includes: a plurality of impedance components electrically coupled in series to a circuit node, and a current source electrically coupled between the circuit node and a first power supply.

The impedance circuit may further include an output node, wherein the transistor is electrically coupled between the output node and a second power supply.

A resistor may be electrically coupled between the transistor and the output node.

The first power supply may be configured to provide a first voltage and the second power supply may be configured to provide a second voltage, and the first voltage may be higher than the second voltage.

The first power supply may be configured to provide a first voltage and the second power supply may be configured to provide a second voltage, and the first voltage may be lower than the second voltage.

The voltage source may further include a multiplexer, and the multiplexer may include a high voltage terminal and a low voltage terminal electrically coupled between the circuit node and the first power supply, and the multiplexer may be configured to selectively electrically couple the circuit node to the gate electrode of the transistor in response to a control signal voltage.

The impedance components may include a plurality of diode-connected transistors or a plurality of diodes.

Each of the impedance components may be configured to have a uniform and constant voltage drop.

According to another embodiment of the present invention, in a method of making an impedance circuit, the method includes: electrically coupling a voltage source to a gate electrode of a transistor; and applying a gate voltage from the voltage source to the gate electrode of the transistor, wherein the voltage source includes: a plurality of impedance components electrically coupled in series to a circuit node, and a current source electrically coupled between the circuit node and a first power supply.

The method may further include electrically coupling the transistor between an output node of the impedance circuit and a second power supply.

The method may further include providing a first voltage from the first power supply; and providing a second voltage from the second power supply, wherein the first voltage is higher than the second voltage.

The method may further include providing a first voltage from the first power supply; and providing a second voltage from the second power supply, wherein the first voltage is lower than the second voltage.

The impedance components may include a plurality of diode-connected transistors or a plurality of diodes.

BRIEF DESCRIPTION OF THE DRAWINGS

A more complete appreciation of the present invention, and many of the attendant features and aspects thereof, will become more readily apparent as the invention becomes better understood by reference to the following detailed descrip

DETAILED DESCRIPTION

The detailed description set forth below in connection with the appended drawings is intended as a description of exemplary embodiments of the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features. Expressions such as "at least one of," when preceding a list of elements, modify the entire list of elements and do not modify the individual elements of the list. Further, the use of "may" when describing embodiments of the present invention refers to "one or more embodiments of the present invention."

In many electrical device applications, it is desirable to have components that provide a resistance or impedance that is relatively constant, regardless of the voltage across the component. For example, in signal transmission applications a termination circuit may be provided at an input and/or an output of the transmission line in order to reduce reflections or distortions in signals propagated along the transmission line.

Figure 1B:
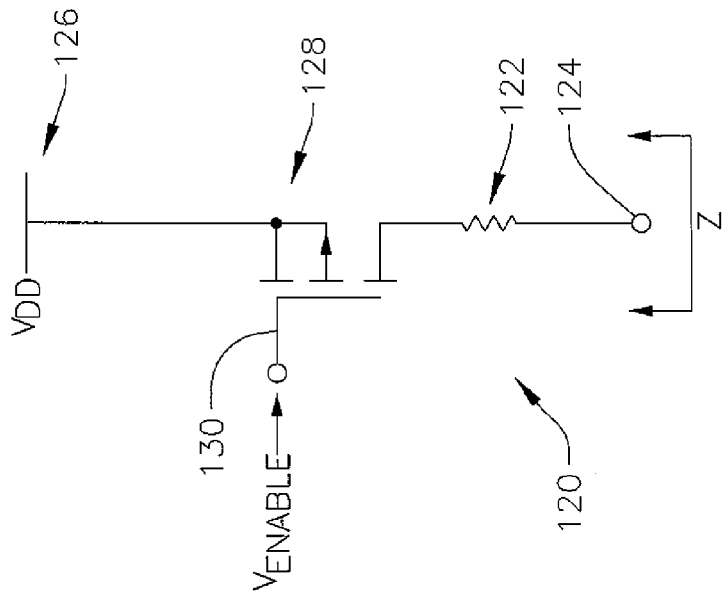
- FIGS. 1a and 1b illustrate impedance components implemented in termination circuits using n-channel (NMOS) or p-channel (PMOS) transistors.
Figure 1A:
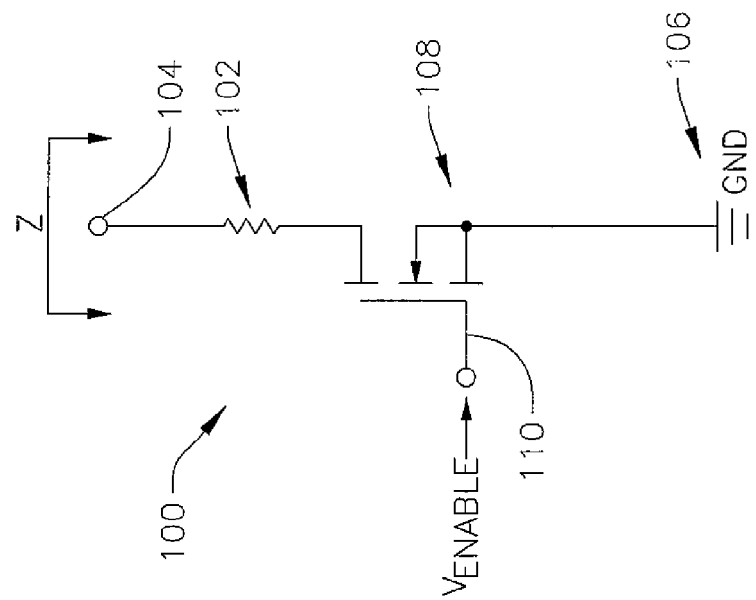

As shown in FIG. 1a, a termination circuit 100 may include a resistor 102 coupled between an output node 104 and a power supply 106 providing a low voltage GND. A transistor 108 is further coupled between the resistor 102 and the power supply 106. The transistor 108 is configured to be turned on in response to a control signal voltage $V_{ENABLE}$ applied to a gate electrode 110 of the transistor 108 to electrically couple the output node 104 to the power supply 106 through the resistor 102 and the transistor 108. The transistor 108 may be an n-channel (NMOS) transistor that is configured to be turned on when the control signal voltage $V_{ENABLE}$ is equal to a high voltage $V_{DD}$, and is configured to be turned off when the control signal voltage $V_{ENABLE}$ is equal to a low voltage (e.g., ground). Because the transistor 108 is configured to be turned on in response to a high voltage $V_{DD}$ being applied to the gate electrode 110, and the source electrode is coupled to the low voltage GND supplied by the power supply 106, the gate-to-source voltage $V_{GS}$ of the transistor 108 when the transistor 108 is turned on is equal to $V_{DD}$.

FIG. 1b illustrates a termination circuit 120, similar to the termination circuit 100 of FIG. 1a, but utilizes a p-channel (PMOS) transistor instead of an NMOS transistor as an impedance component. The termination circuit 120 includes a resistor 122 coupled between an output node 124 and a power supply 126 providing a high voltage $V_{DD}$. A transistor 128 is further coupled between the resistor 122 and the power supply 126. The transistor 128 is configured to be turned on in response to a control signal voltage $V_{ENABLE}$ applied to a gate electrode 130 of the transistor 128 to electrically couple the output node 124 to the power supply 126 through the resistor 122 and the transistor 128. The transistor 128 is configured to be turned on when the control signal voltage $V_{ENABLE}$ is equal to a low voltage. Because the transistor 128 is configured to be turned on in response to a low voltage (e.g., ground) being applied to the gate electrode 110, and the source electrode is coupled to the power supply 126 supplying the high voltage $V_{DD}$, the gate-to-source voltage $V_{GS}$ of the transistor 128 when the transistor 128 is turned on is equal to $-V_{DD}$.

Accordingly, the gate-to-source voltage $V_{GS}$ of both the transistor 108, which is an NMOS transistor, and the transistor 128, which is a PMOS transistor, are a function of the high voltage $V_{DD}$. In the case of the NMOS transistor 108, $V_{GS}$ is equal to $V_{DD}$. In the case of the PMOS transistor 128, $V_{GS}$ is equal to $-V_{DD}$.

The collective impedance Z of the termination circuits 100 or 120 may be designed to closely match the impedance of a transmission line coupled to the output nodes 104 or 124. For example, the termination circuits 100 or 120 may be designed to operate at an impedance Z in a range of 50-100 Ohms (Ω). Of course, the resistance or impedance of the resistors 102 or 122 generally does not tend to vary as the voltages across the resistors 102 or 122 vary, because resistors are linear devices.

On the other hand, the impedance of the transistors 108 or 128, which are in series with the resistors 102 and 122, respectively, will tend to vary as the voltage through the termination circuits 100 and 120 varies. The current of a transistor in saturation mode, for example, is illustrated in equation (1), below:

$$I_{DSsat} = k \cdot \frac{W}{2L} \cdot (V_{GS} - V_{TH})^2 \cdot (1 + \lambda \cdot V_{DS}) \tag{1}$$

where $I_{DSsat}$ is the current of the transistor biased in saturation mode, and k is a constant equal to $\mu \cdot C_{OX}$, where $\mu$ is the mobility and $C_{OX}$ is the oxide capacitance. W is the channel width of the transistor, L is the channel length of the transistor, $V_{GS}$ is the gate-to-source voltage, $V_{TH}$ is the threshold voltage, $\lambda$ is the channel-length modulation parameter, and $V_{DS}$ is the drain-to-source voltage.

The current of a transistor in triode mode, for example, is illustrated in equation (2), below:

$$I_{DStriode} = k \cdot \frac{W}{L} \cdot \left[(V_{GS} - V_{TH}) \cdot V_{DS} - \frac{V_{DS}^2}{2}\right] \tag{2}$$

where $I_{DStriode}$ is the current of the transistor biased in triode mode.

The impedance of a transistor in saturation mode is illustrated in equation (3), below:

$$Z_{DSsat} = \left[\lambda k \cdot \frac{W}{2L}(V_{GS} - V_{TH})^2\right]^{-1} \tag{3}$$

where $Z_{DSsat}$ is the impedance of the transistor in saturation mode.

The impedance of a transistor in triode mode is illustrated in equation (4), below:

$$Z_{DStriode} = \left[ k \cdot \frac{W}{L}(V_{GS} - V_{TH} - V_{DS}) \right]^{-1} \quad (4)$$

where $Z_{DStriode}$ is the impedance of a transistor in triode mode.

Thus, as illustrated in equations (1)-(4), the impedance of a transistor is inversely proportional to the gate-to-source voltage $V_{GS}$. As discussed, however, the gate-to-source voltage $V_{GS}$ of the NMOS transistor 108 of the termination circuit 100 is equal to $V_{DD}$. Similarly, as discussed, the gate-to-source voltage $V_{GS}$ of the PMOS transistor 128 of the termination circuit 120 is equal to $-V_{DD}$. Thus, substituting $V_{DD}$ for the gate-to-source voltage VGS in equation (3), the impedance of the NMOS transistor 108 operating in saturation mode and triode mode is inversely proportional to the high voltage $V_{DD}$, as illustrated in the below equations (5) and (6), respectively:

$$Z_{DSsat} = \left[ \lambda k \cdot \frac{W}{2L}(V_{DD} - V_{TH})^2 \right]^{-1} \quad (5)$$

$$Z_{DStriode} = \left[ k \cdot \frac{W}{L}(V_{DD} - V_{TH} - V_{DS}) \right]^{-1} \quad (6)$$

In the case of the PMOS transistor 128, the high voltage $V_{DD}$ in equations (5) and (6) can be substituted with $-V_{DD}$ to demonstrate that the impedance of the PMOS transistor 128 is inversely proportional to $-V_{DD}$. In either case, whether the termination circuit utilizes an NMOS transistor as in the termination circuit 100, or a PMOS transistor as in the termination circuit 120, the impedance of the transistor is inversely proportional to the high voltage $V_{DD}$. Accordingly, the impedance of the transistors 108 and 128, and therefore the overall impedance of the termination circuits 100 and 120, may be relatively sensitive to variations in the value of the high voltage $V_{DD}$.

Figure 1C:
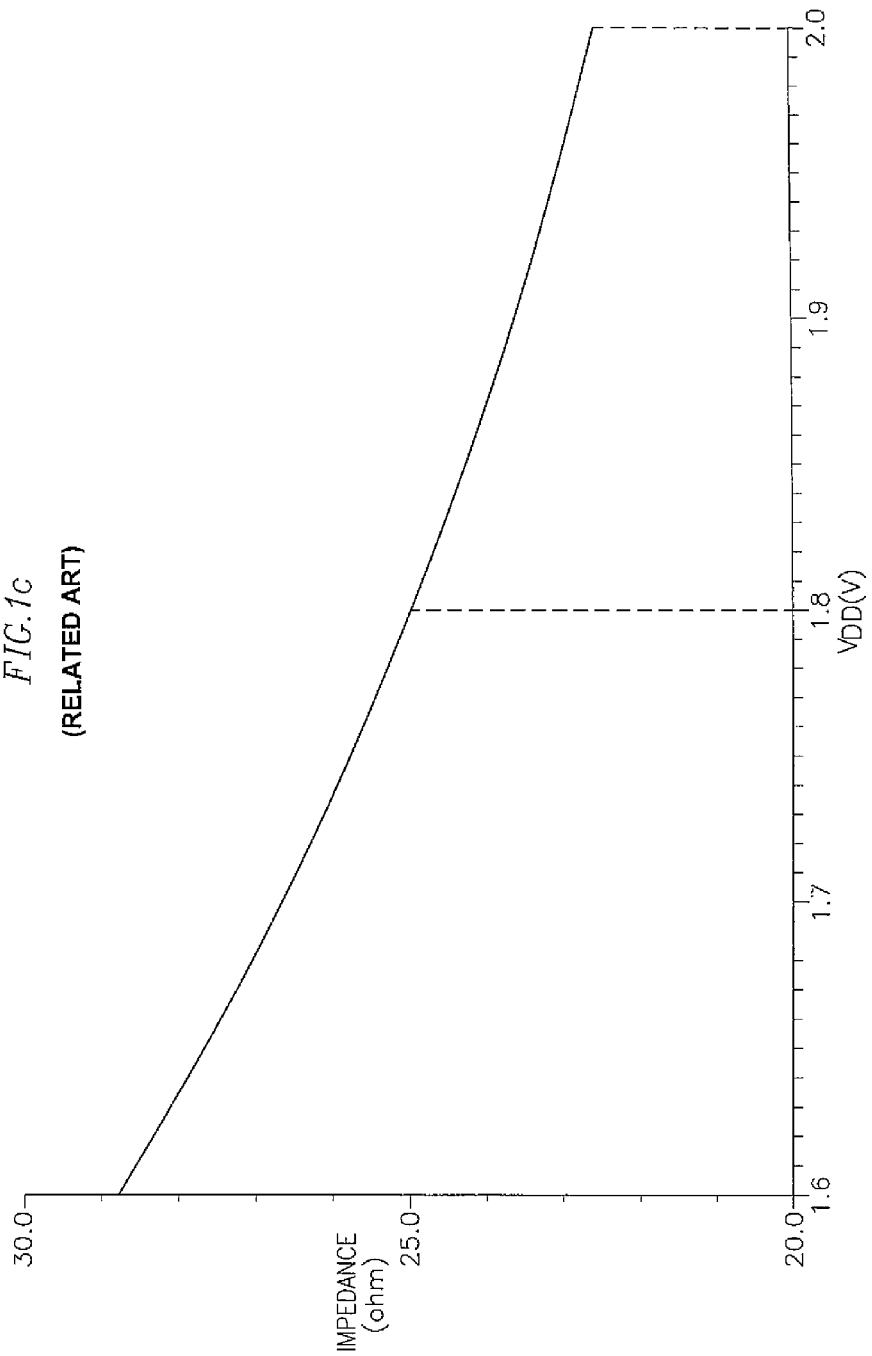
FIGS. 1c and 1d illustrate variations of the impedance of the termination circuits of FIGS. 1a and 1b in relation to variations in the power supply voltage.

For example, FIG. 1c illustrates the impedance of the transistors 108 or 128 in FIGS. 1a and 1b relative to the high voltage $V_{DD}$. The transistor may be designed, based on the size of the channel width and length, to operate at any impedance for a corresponding nominal voltage value according to the design and function of the termination circuit. For example, the transistor may have a relatively high channel width to channel length ratio (e.g., a channel width of 107 micrometers (μm) and a channel length of 0.18 μm), such that the transistor has an impedance of approximately 25Ω at a nominal high voltage $V_{DD}$ of approximately 1.8 V. Under such parameters, although the impedance of the transistor may be approximately 25Ω at a nominal high voltage $V_{DD}$ of approximately 1.8 V, as the high voltage $V_{DD}$ is reduced to 1.6 V, because the impedance of the transistor is inversely proportional to the high voltage $V_{DD}$, the impedance of the transistor may increase, for example, to approximately 28.7Ω. As the high voltage $V_{DD}$ is increased to 2.0 V, the impedance of the transistor may decrease, for example, to approximately 22.6Ω. Thus, the impedance of the transistor may vary by +/−12% as the high voltage $V_{DD}$ varies between 1.6 V and 2.0 V.

Figure 1D:
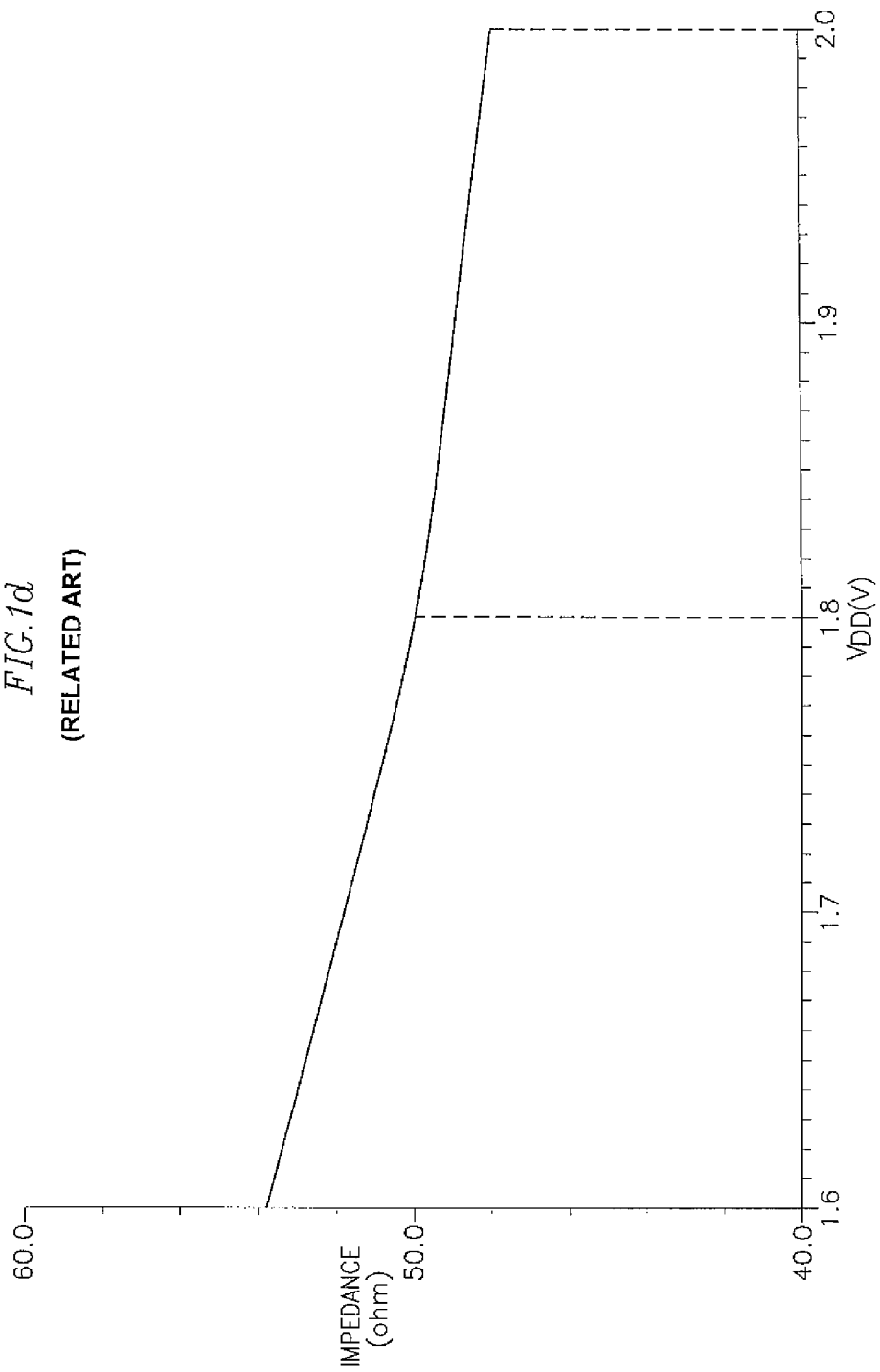

When combined with the constant impedances of the resistors 102 or 122, which will not tend to vary as the high voltage $V_{DD}$ varies, the overall impedance of the termination circuits 100 and 120 are still relatively sensitive to changes in the high voltage $V_{DD}$. FIG. 1d illustrates variations in the overall impedance of the termination circuits 100 or 120, from the collective impedance of the resistor 102 and the transistor 108, or the resistor 122 and the transistor 128, in relation to variations in the high voltage $V_{DD}$.

The termination circuit may operate at any impedance for a corresponding nominal power supply voltage value, based on the channel width and length of the transistor and the resistance of the resistor, according to the design and function of the termination circuit. For example, the termination circuit may be designed to have an impedance of approximately 50Ω at a nominal high voltage $V_{DD}$ of approximately 1.8 V, with the resistor having a resistance of 25Ω, and the transistor having an impedance of approximately 25Ω at the nominal high voltage $V_{DD}$ of approximately 1.8 V. Under such parameters, as illustrated in FIG. 1d, although the impedance of the termination circuit may be approximately 50Ω at a nominal high voltage $V_{DD}$ of approximately 1.8 V, as the high voltage $V_{DD}$ is reduced to 1.6 V, because the impedance of the transistor is inversely proportional to the high voltage $V_{DD}$, the impedance of the termination circuit may increase to approximately 53.8Ω. Similarly, as the high voltage $V_{DD}$ is increased to 2.0 V, the impedance of the termination circuit may decrease to approximately 47.8Ω. Thus, the collective impedance of the termination circuit may vary by +/−6% as the high voltage $V_{DD}$ varies between 1.6 V and 2.0 V.

Figure 2A:
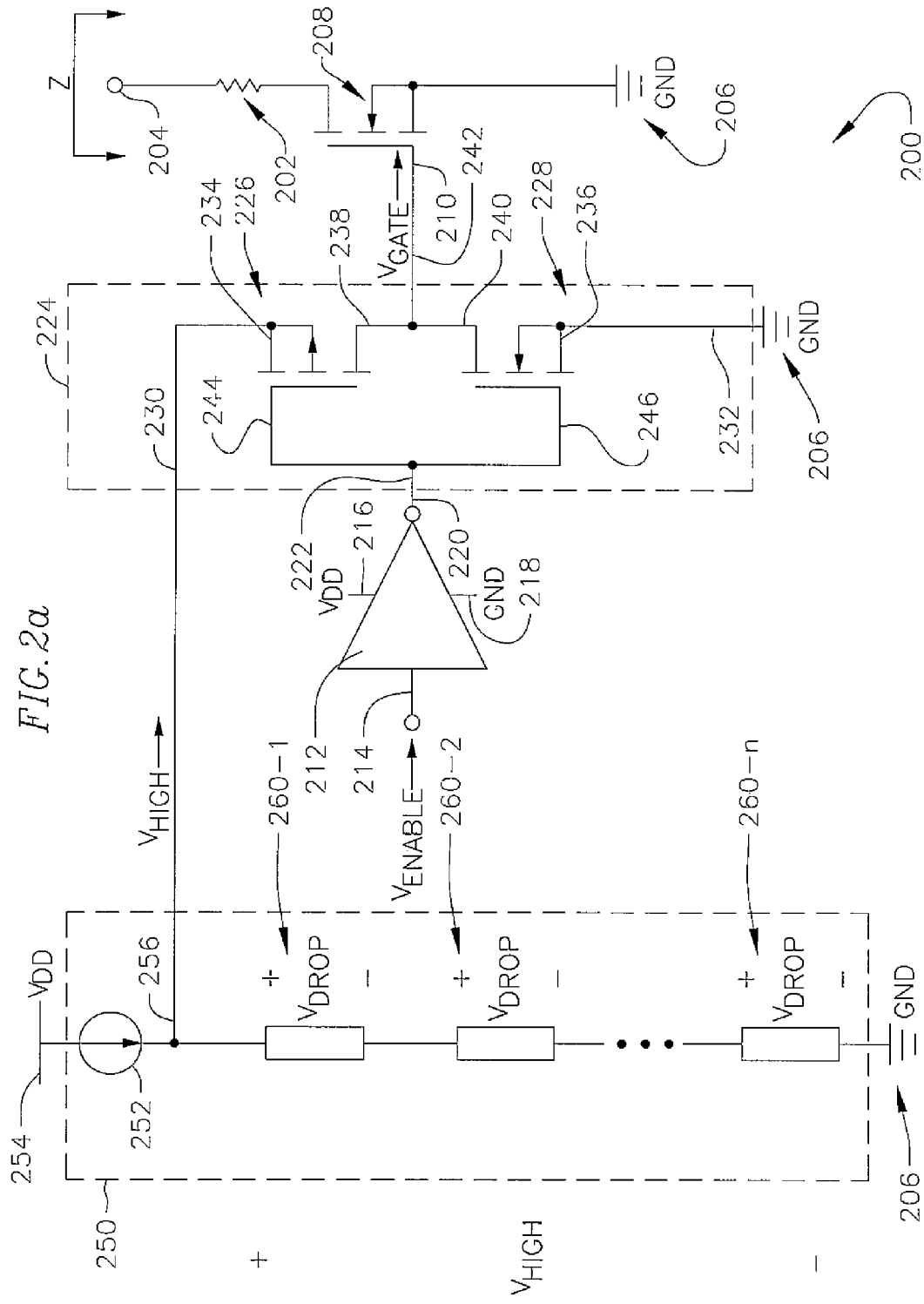
FIGS. 2a-2d illustrate impedance components implemented in termination circuits having low sensitivity to power supply variations.

Accordingly, as illustrated in FIGS. 1a-1d, a termination circuits 100 and 120, which utilize NMOS transistors and PMOS transistors, respectively, are relatively sensitive to changes in the high voltage $V_{DD}$. FIGS. 2a-2f illustrate an impedance component implemented in a termination circuit in which the impedance of the termination circuit is relatively insensitive to changes in the power supply voltage. Referring to FIG. 2a, a termination circuit 200 may include a resistor 202 coupled between an output node 204 and a power supply 206 configured to supply a low voltage or ground voltage GND. A first transistor 208 is further coupled between the resistor 202 and the power supply 206. The first transistor 208 is configured to be turned on in response to a voltage $V_{GATE}$ applied to a gate electrode 210 of the first transistor 208 to electrically couple the output node 204 to the power supply 206 through the resistor 202 and the first transistor 208. The first transistor 208 may be an n-channel (NMOS) transistor that is configured to be turned on when $V_{GATE}$ is equal to a high voltage $V_{HIGH}$, where $V_{HIGH}$ is equal to an integer n multiplied by the threshold voltage $V_{TH}$ of the first transistor 208, such that $V_{HIGH}=n \cdot V_{TH}$.

The termination circuit 200 further includes a first inverter 212 configured to receive a control signal voltage $V_{ENABLE}$ at an input terminal 214 from an external control signal source. A high voltage terminal 216 of the first inverter 212 is coupled to the high voltage $V_{DD}$, and a low voltage terminal 218 of the first inverter 212 is coupled to the low voltage GND. The first inverter 212 provides an output voltage at the output terminal 220 having a logic level that is inverted from the logic level of the control signal voltage $V_{ENABLE}$. Thus, for example, when the control signal voltage $V_{ENABLE}$ is equal to the high voltage $V_{DD}$, the first inverter 212 may provide an output voltage at the output terminal 220 equal to or corresponding to the low voltage GND. When the control signal voltage $V_{ENABLE}$ is equal to the low voltage GND, the first inverter 212 may provide an output voltage at the output terminal 220 equal to or corresponding to the high voltage $V_{DD}$.

The output terminal 220 of the first inverter 212 is electrically coupled to an input terminal 222 of a second inverter 224. The second inverter 224 includes a second transistor 226 and a third transistor 228, which are electrically coupled in series between a high voltage terminal 230 and a low voltage terminal 232. The high voltage terminal 230 is coupled to the high voltage $V_{HIGH}$, and the low voltage terminal 232 is coupled to the low voltage GND. A first electrode (e.g., a source electrode) 234 of the second transistor 226 is electrically coupled to the high voltage terminal 230, and a first electrode (e.g., a source electrode) 236 of the third transistor 228 is electrically coupled to the low voltage terminal 232. A second electrode 238 of the second transistor 226 and a second electrode 240 of the third transistor 228 are electrically coupled to an output terminal 242 of the second inverter 224. The output terminal 242 of the second inverter 224 is electrically coupled to the gate electrode 210 of the first transistor 208.

A gate electrode 244 of the second transistor 226 and a gate electrode 246 of the third transistor 228 are electrically coupled to the input terminal 222 of the second inverter 224. The second transistor 226 and the third transistor 228 may be a PMOS transistor and an NMOS transistor, respectively, or vice versa, such that the second transistor 226 and the third transistor 228 are configured to be turned on and turned off at opposite times depending on the voltage applied to the input terminal 222. Accordingly, the second inverter 224 is configured to provide either the low voltage GND or the high voltage $V_{HIGH}$ to the output terminal 242 of the second inverter 224 as the gate voltage $V_{GATE}$ in response to the voltage at the input terminal 222 of the second inverter 224.

Collectively, therefore, the first inverter 212 and the second inverter 224 operate as a multiplexer to provide either the high voltage $V_{HIGH}$ or the low voltage GND to the gate electrode 210 of the first transistor 208. The first transistor 208 is configured to turn on when the high voltage $V_{HIGH}$ is applied to the gate electrode 210 of the first transistor 208.

The termination circuit 200 further includes a voltage source 250 configured to provide the high voltage $V_{HIGH}$ to the high voltage terminal 230 of the second inverter 224. The voltage source 250 includes a current source 252 coupled between a power supply 254 and an output terminal 256 of the voltage source 250, where the power supply 254 is, for example, an external power supply capable of providing the high voltage $V_{DD}$. The current source 252 can be any suitable current source capable of providing a relatively constant current despite variations in the high voltage $V_{DD}$. For example, the current source 252 may be a Widlar current source.

The high voltage $V_{HIGH}$ is a high voltage that is relatively close to the high voltage $V_{DD}$, but is constrained by the operational parameters of the current source 252. For example, if the high voltage $V_{HIGH}$ is equal to the high voltage $V_{DD}$, the voltage drop across the current source 252 will be zero volts. A current source, however, requires some voltage drop in order to operate. Therefore, if the high voltage $V_{HIGH}$ is equal to the high voltage $V_{DD}$, the current source 252 will not operate. Accordingly, the high voltage $V_{HIGH}$ is a high voltage relatively close to the high voltage $V_{DD}$, but where $V_{DD}-V_{HIGH}$ is greater than or equal to the minimum operating voltage across the current source 252. In one embodiment, for example, the minimum operating voltage across the current source 252 may be approximately 0.2 V. Thus, the high voltage $V_{HIGH}$ is approximately equal to $V_{DD}-0.2$ V. The minimum operating voltage across the current source 252, however, may vary according to the design and function of the current source 252 and the termination circuit 200.

The voltage source 250 further includes one or more impedance components 260-1 through 260-$n$ coupled between the output terminal 256 of the voltage source 250 and the low voltage power source 206 providing the low voltage GND, where n is an integer greater than zero. The collective voltage drop across all of the impedance components 260-1 through 260-$n$ is approximately equal to the high voltage $V_{HIGH}$ such that $$n = \frac{V_{HIGH}}{V_{DROP}}.$$

Collectively, the voltage source 250, the first inverter 212, and the second inverter 224 operate as a voltage source configured to apply the gate voltage $V_{GATE}$ to the gate electrode 210 of the first transistor 208 depending on the control signal voltage $V_{ENABLE}$.

The impedance components 260-1 through 260-$n$, may be any suitable electronic component that is selected or designed to have a relatively constant and uniform voltage drop $V_{DROP}$ across the impedance components, such that $$n = \frac{V_{HIGH}}{V_{DROP}}.$$

For example, the impedance components 260-1 through 260-$n$ may be diode-connected transistors, or diodes, each having a relatively constant voltage drop that is approximately equal or uniform for each of the impedance components 260-1 through 260-$n$.

By way of illustration, assuming the high voltage source 254 provides a nominal high voltage $V_{DD}$ of approximately 1.8 V, and the current source 252 has a minimum operational voltage drop of 0.2 V such that the voltage $V_{HIGH}$ is equal to approximately 1.6 V, and each of the impedance components 260-1 through 260-$n$ has a fixed voltage drop of 0.4 V, then the number of impedance components 260-1 through 260-$n$ is equal to 4, because $$n = \frac{V_{HIGH}}{V_{DROP}}.$$

The constant voltage drop $V_{DROP}$ of the impedance components 260-1 through 260-$n$, however, may vary according to the design and function of the termination circuit 200 and the impedance components 260-1 through 260-$n$, so long as the high voltage $V_{HIGH}$ is approximately equal to $n \cdot V_{DROP}$.

Figure 2B:
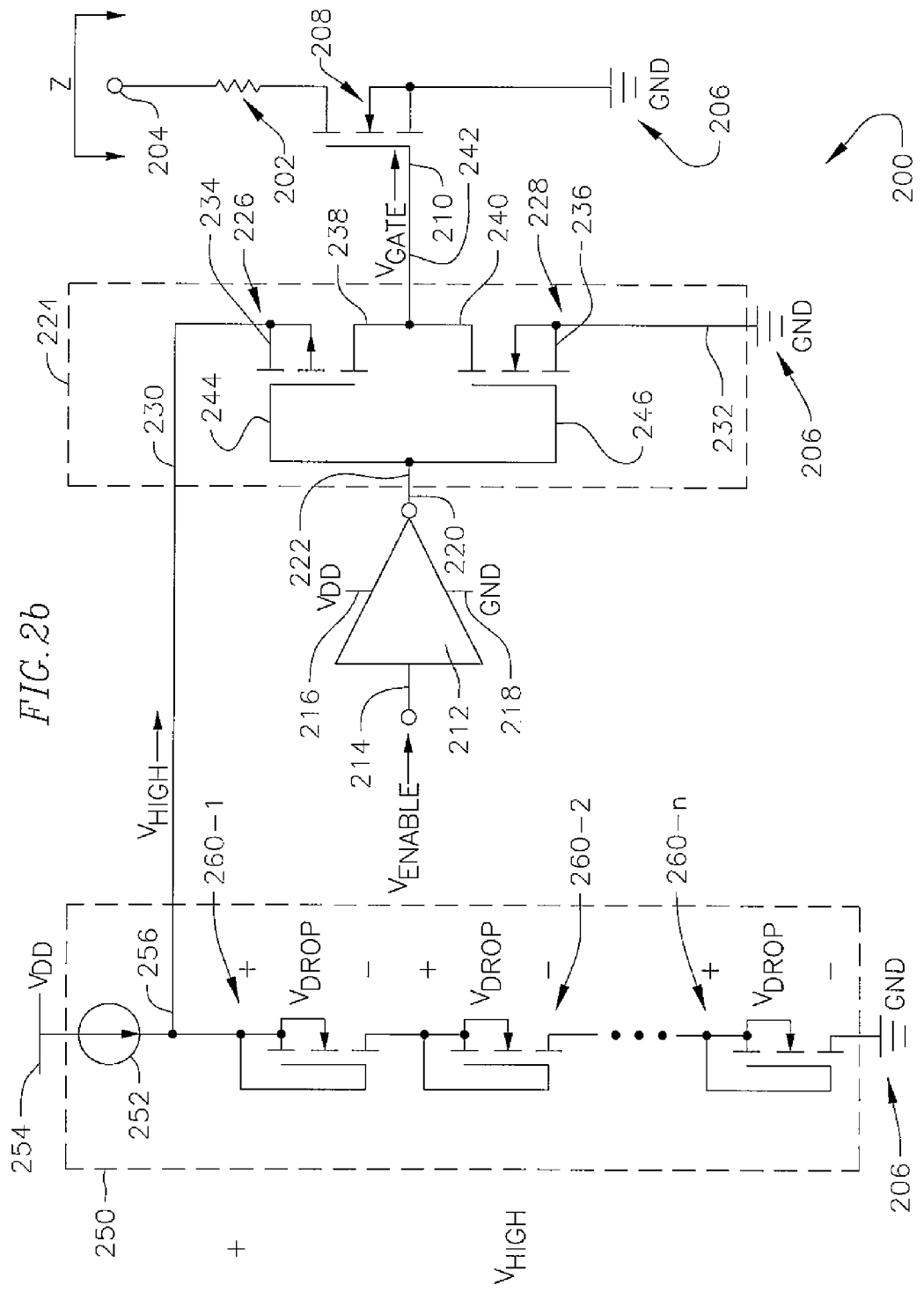

FIG. 2b illustrates further detail of the termination circuit 200 and the impedance components 260-1 through 260-$n$, in which the impedance components 260-1 through 260-$n$ are a plurality of diode-connected NMOS transistors 260-1 through 260-$n$ coupled in series between the output terminal of the voltage source 250 and the low voltage power source 206. As discussed, however, the impedance components 260-1 through 260-$n$ may be any suitable impedance component (e.g., one or more diodes) having a relatively constant and uniform voltage drop, according to the design and function of the termination circuit 200.

Figure 2C:
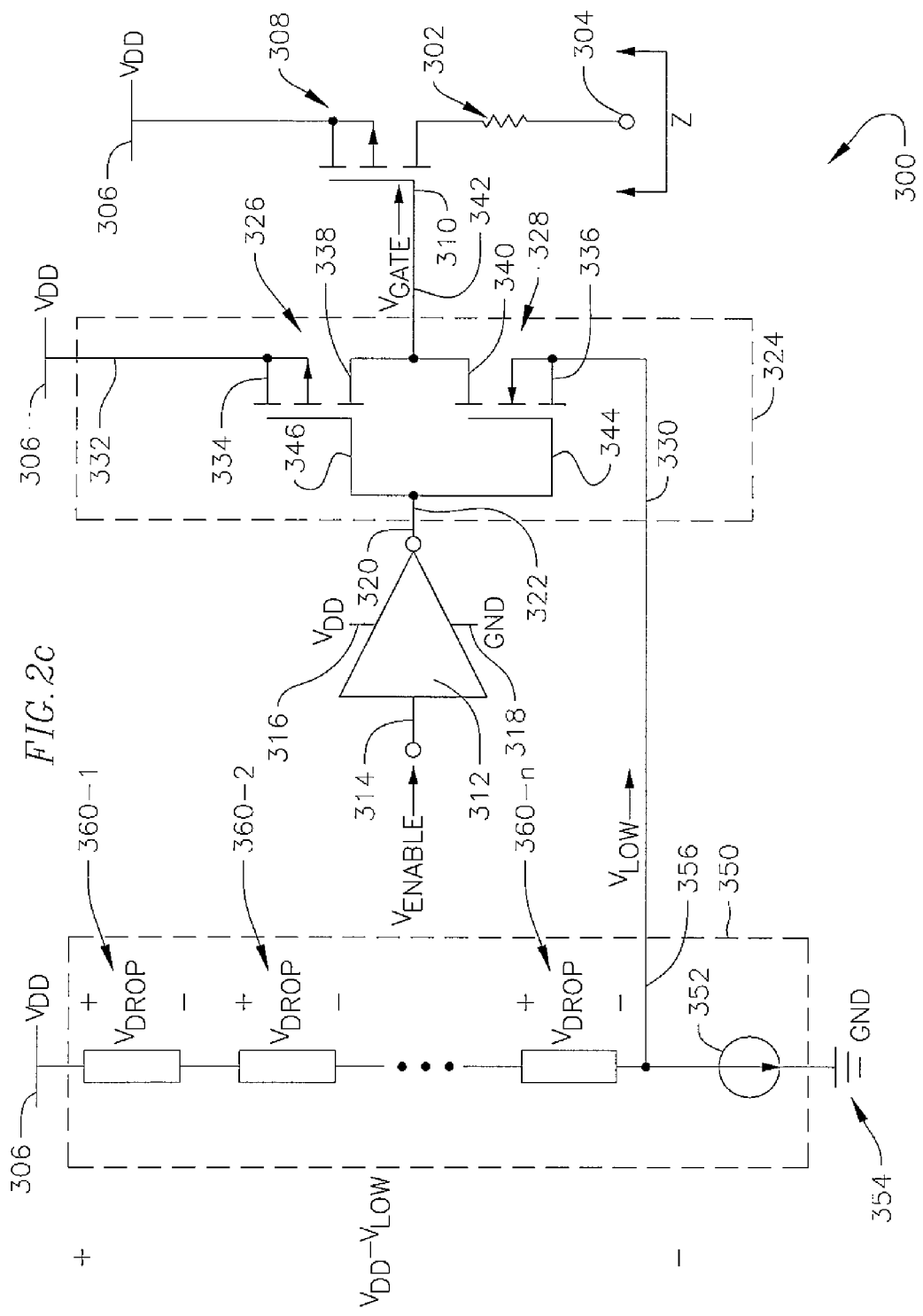

FIG. 2c illustrates an arrangement similar to the termination circuit in FIGS. 2a and 2b, in which the termination circuit utilizes a p-channel (PMOS) transistor. Referring to FIG. 2c, a termination circuit 300 may include a resistor 302 coupled between a output node 304 and a high voltage power supply 306 configured to supply a high voltage $V_{DD}$. A first transistor 308 is further coupled between the resistor 302 and the power supply 306. The first transistor 308 is configured to be turned on in response to a gate voltage $V_{GATE}$ applied to a gate electrode 310 of the first transistor 308 to electrically couple the output node 304 to the power supply 306 through the resistor 302 and the first transistor 308. The first transistor 308 may be a p-channel (PMOS) transistor that is configured to be turned on when the gate voltage $V_{GATE}$ is equal to a low voltage $V_{LOW}$, where $V_{LOW}$ equal to the high voltage VDD minus n·$V_{TH}$, such that $V_{LOW}=V_{DD}-n\cdot V_{TH}$.

The termination circuit 300 further includes a first inverter 312 configured to receive a control signal voltage $V_{ENABLE}$ at an input terminal 314 from an external control signal source. The high voltage VDD is applied to a high voltage terminal 316 of the first inverter 312, and the low voltage GND is applied to a low voltage terminal 318 of the first inverter 312. The first inverter 312 provides an output voltage at the output terminal 320 having a logic level that is inverted from the logic level of the control signal voltage $V_{ENABLE}$. Thus, for example, when the control signal voltage $V_{ENABLE}$ is equal to the high voltage $V_{DD}$, the first inverter 312 may provide a low output voltage at the output terminal 320 that is equal to or corresponds to the low voltage GND. When the control signal voltage $V_{ENABLE}$ is equal to the low voltage GND, the first inverter 312 may provide a high output voltage at the output terminal 320 that is equal to or corresponds to the high voltage $V_{DD}$.

The output terminal 320 of the first inverter 312 is electrically coupled to an input terminal 322 of a second inverter 324. The second inverter 324 includes a second transistor 326 and a third transistor 328, which are electrically coupled in series between a low voltage terminal 330 and a high voltage terminal 332. A low voltage $V_{LOW}$ is applied to the low voltage terminal 330, and the high voltage $V_{DD}$ is applied to the high voltage terminal 332. A first electrode (e.g., a source electrode) 334 of the second transistor 326 is electrically coupled to the high voltage terminal 330, and a first electrode (e.g., a source electrode) 336 of the third transistor 328 is electrically coupled to the low voltage terminal 333. A second electrode (e.g., a drain electrode) 338 of the second transistor 326 and a second electrode (e.g., a drain electrode) 340 of the third transistor 328 are electrically coupled to an output terminal 342 of the second inverter 324. The output terminal 342 of the second inverter 324 is electrically coupled to the gate electrode 310 of the first transistor 308.

A gate electrode 344 of the second transistor 326 and a gate electrode 346 of the third transistor 328 are electrically coupled to the input terminal 322 of the second inverter 324. The second transistor 326 and the third transistor 328 may be a PMOS transistor and an NMOS transistor, respectively, or vice versa, such that the second transistor 326 and the third transistor 328 are configured to be turned on and turned off at opposite times depending on the voltage applied to the input terminal 322. Accordingly, the second inverter 324 is configured to provide either the high voltage $V_{DD}$ or the low voltage $V_{LOW}$ to the output terminal 342 of the second inverter 324 in response to the voltage at the input terminal 322.

Collectively, therefore, the first inverter 312 and the second inverter 324 operate as a multiplexer to provide either the high voltage $V_{DD}$ or the low voltage $V_{LOW}$ to the gate electrode 310 of the first transistor 308 as the gate voltage $V_{GATE}$. The first transistor 308 is configured to turn on when the low voltage $V_{LOW}$ is applied to the gate electrode 310 of the first transistor 308.

The termination circuit 300 further includes a voltage source 350 configured to provide the low voltage $V_{LOW}$ to the low voltage terminal 330 of the second inverter 324. The voltage source 350 includes a current source 352 coupled between a low voltage power supply 354 and an output terminal 356 of the voltage source 350, where the low voltage power supply 354 is, for example, an external power supply capable of providing a low voltage GND. The current source 352 can be any suitable current source capable of providing a relatively constant current despite variations in the high voltage $V_{DD}$. For example, the current source 352 may be a Widlar current source.

The low voltage $V_{LOW}$ is a low voltage that is relatively close to the low voltage GND, but is constrained by the operational parameters of the current source 352. For example, if the low voltage $V_{LOW}$ is equal to the low voltage GND, the voltage drop across the current source 352 will be zero volts. Because a current source requires some voltage drop in order to operate, if the low voltage $V_{LOW}$ is equal to the low voltage GND, the current source 352 will not operate. Accordingly, the low voltage $V_{LOW}$ is a low voltage relatively close to the low voltage GND, but where $V_{LOW}$–GND is greater than or equal to the minimum operating voltage across the current source 352. In one embodiment, for example, the minimum operating voltage across the current source 352 may be approximately 0.2 V. Thus, the low voltage $V_{LOW}$ is equal to approximately 0.2 V. The minimum operating voltage across the current source 352, however, may vary according to the design and function of the current source 352 and the termination circuit 300.

The voltage source 350 further includes one or more impedance components 360-1 through 360-n coupled between the output terminal 356 of the voltage source 356 and the high voltage power source 306 providing the high voltage $V_{DD}$, where n is an integer greater than zero. The collective voltage drop across all of the impedance components 360-1 through 360-n is approximately equal to the high voltage $V_{DD}$ minus the low voltage $V_{LOW}$ such that $$n = \frac{V_{DD} - V_{LOW}}{V_{DROP}}.$$

Collectively, the voltage source 350, the first inverter 312, and the second inverter 324 operate as a voltage source configured to apply the gate voltage $V_{GATE}$ to the gate electrode 310 of the first transistor 308 depending on the control signal voltage $V_{ENABLE}$.

The impedance components 360-1 through 360-n, may be any suitable electronic component that is selected or designed to have a relatively constant and uniform voltage drop $V_{DROP}$ across the impedance component, such that $$n = \frac{V_{DD} - V_{LOW}}{V_{DROP}}.$$

For example, the impedance components 360-1 through 360-n may be diode-connected transistors, or diodes, each having a relatively constant voltage drop that is approximately equal for each of the impedance components 360-1 through 360-n. By way of illustration, assuming the high voltage source 306 provides a nominal high voltage $V_{DD}$ of approximately 1.8 V, and the current source 252 has a minimum operational voltage drop of 0.2 V such that the low voltage $V_{LOW}$ is equal to approximately 0.2 V, and each of the impedance components 360-1 through 360-n has a fixed voltage drop of 0.4 V, then the number of impedance components 360-1 through 360-n is equal to 4, because $$n = \frac{V_{DD} - V_{LOW}}{V_{DROP}}.$$

The constant voltage drop $V_{DROP}$ of the impedance components 360-1 through 360-n, however, may vary according to the design and function of the termination circuit 300 and the impedance components 360-1 through 360-n, where the high voltage $V_{DD}$ minus the low voltage $V_{LOW}$ is equal to $n \cdot V_{DROP}$.

Figure 2D:
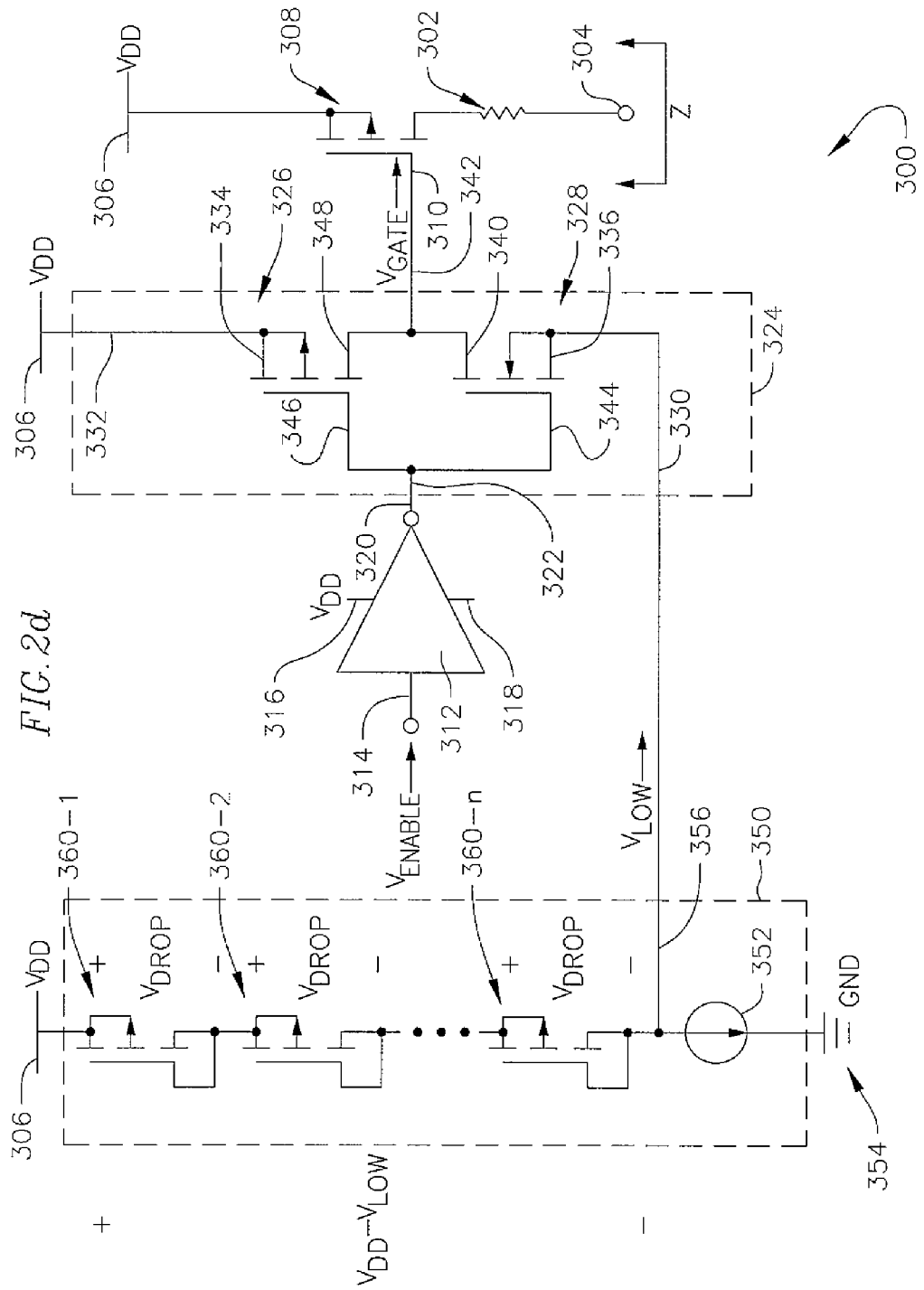

FIG. 2d illustrates further detail of the termination circuit 300 and the impedance components 360-1 through 360-n, in which the impedance components 360-1 through 360-n are a plurality of diode-connected PMOS transistors 360-1 through 360-n coupled in series between the output terminal 356 of the voltage source 350 and the high voltage power source 306. The impedance components 360-1 through 360-n, however, may be any suitable impedance components (e.g., one or more diodes) having a relatively constant voltage drop, according to the design and function of the termination circuit 300.

As discussed, with respect to equations (1)-(6) and illustrated in FIGS. 1c and 1d, the impedance of the transistor 108 and 128 in FIGS. 1a and 1b is proportional to the high voltage $V_{DD}$. Thus, the impedance of the transistors 108 and 128, and therefore the overall impedance of the termination circuits 100 and 120, may be relatively sensitive to variations in the value of the high voltage $V_{DD}$, because the gate-to-source voltage $V_{GS}$ of the NMOS transistor 108 of the termination circuit 100 is equal to $V_{DD}$, and the gate-to-source voltage $V_{GS}$ of the PMOS transistor 128 of the termination circuit 120 is equal to $-V_{DD}$.

By contrast, however, for the termination circuit 200, the gate voltage $V_{GATE}$ applied to the gate electrode 210 of the first transistor 208 is equal to the high voltage $V_{HIGH}$ when the first transistor 208 is turned on, and $V_{HIGH} = n \cdot V_{TH}$. The gate-to-source voltage $V_{GS}$ of the first transistor 208 is equal to the high voltage $V_{HIGH}$ minus the low voltage GND. Accordingly, $V_{GS} = n \cdot V_{TH} - 0 = n \cdot V_{TH}$. Substituting $n \cdot V_{TH}$ for the gate-to-source voltage $V_{GS}$ in equations (3) and (4), above, the impedance Z of the NMOS transistor 208 in saturation mode and triode mode is illustrated in equations (7) and (8) below:

$$Z_{DSsat} = \left[ \lambda k \cdot \frac{W}{2L} (n \cdot V_{TH} - V_{TH})^2 \right]^{-1} \quad (7)$$

$$Z_{DStriode} = \left[ k \cdot \frac{W}{L} (n \cdot V_{TH} - V_{TH} - V_{DS}) \right]^{-1} \quad (8)$$

Similarly, for the termination circuit 300, the gate voltage $V_{GATE}$ applied to the gate electrode 310 of the first transistor 308 is equal to the low voltage $V_{LOW}$ when the first transistor 308 is turned on, and $V_{LOW} = V_{DD} - n \cdot V_{TH}$. The gate-to-source voltage $V_{GS}$ of the first transistor 308 is equal to $V_{LOW} - V_{DD}$. Accordingly, $V_{GS} = V_{DD} - n \cdot V_{TH} - V_{DD} = -n \cdot V_{TH}$. Therefore, the impedance of the PMOS transistor 308 in saturation mode and triode mode is illustrated in equations (9) and (10) below:

$$Z_{DSsat} = \left[ \lambda k \cdot \frac{W}{2L} (-n \cdot V_{TH} - V_{TH})^2 \right]^{-1} \quad (9)$$

$$Z_{DStriode} = \left[ k \cdot \frac{W}{L} (-n \cdot V_{TH} - V_{TH} - V_{DS}) \right]^{-1} \quad (10)$$

Thus, the impedance of the NMOS transistor 208 and the PMOS transistor 308 is not proportional to the high voltage $V_{DD}$ and therefore is relatively insensitive to fluctuations in the high voltage $V_{DD}$ compared to the termination circuits 100 and 120.

Figure 2E:
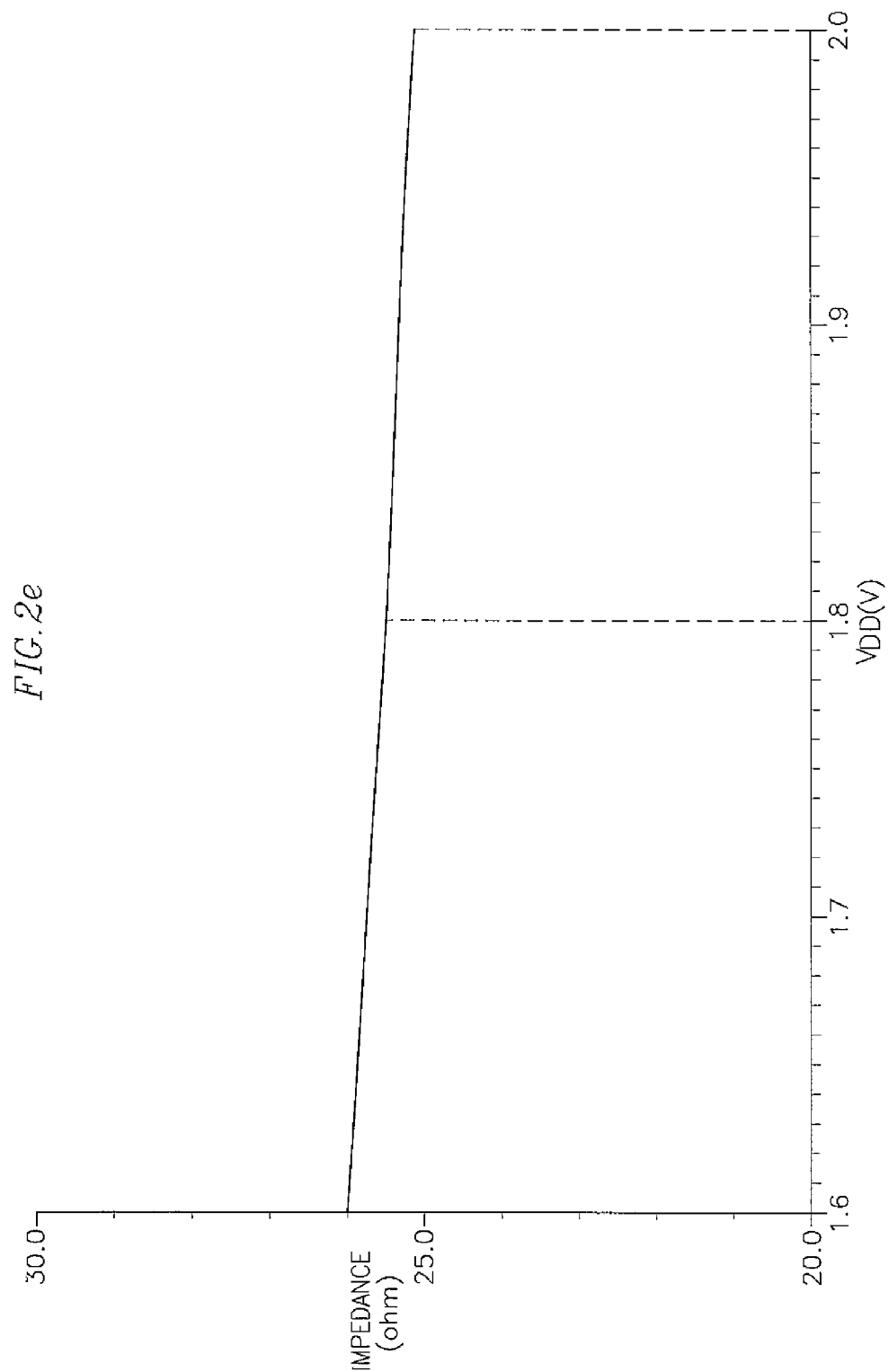
FIGS. 2e and 2f illustrate variations of the impedance of the termination circuits of FIGS. 2a-2d in relation to variations in the power supply voltage.

FIG. 2e illustrates the impedance of the transistors 208 or 308 in FIGS. 2a-2d relative to changes in the high voltage $V_{DD}$. The transistors 208 or 308 may be designed, based on the size of the channel width and length, to operate at any impedance for a corresponding nominal voltage value according to the design and function of the termination circuit. For example, the transistor may have a channel width of 135 μm and a channel length of 0.18 μm, such that the transistor has an impedance of approximately 25.5Ω at a nominal high voltage $V_{DD}$ of approximately 1.8 V. As the high voltage $V_{DD}$ is reduced to 1.6 V, because the impedance of the transistor is relatively less sensitive to changes in the high voltage $V_{DD}$, the impedance of the transistor may only increase to approximately 26Ω. Similarly, as the high voltage $V_{DD}$ is increased to 2.0 V, the impedance of the transistor may be approximately 25.1Ω. Thus, the impedance of the transistor may vary by +/−2% as the high voltage $V_{DD}$ varies between 1.6 V and 2.0 V.

Figure 2F:
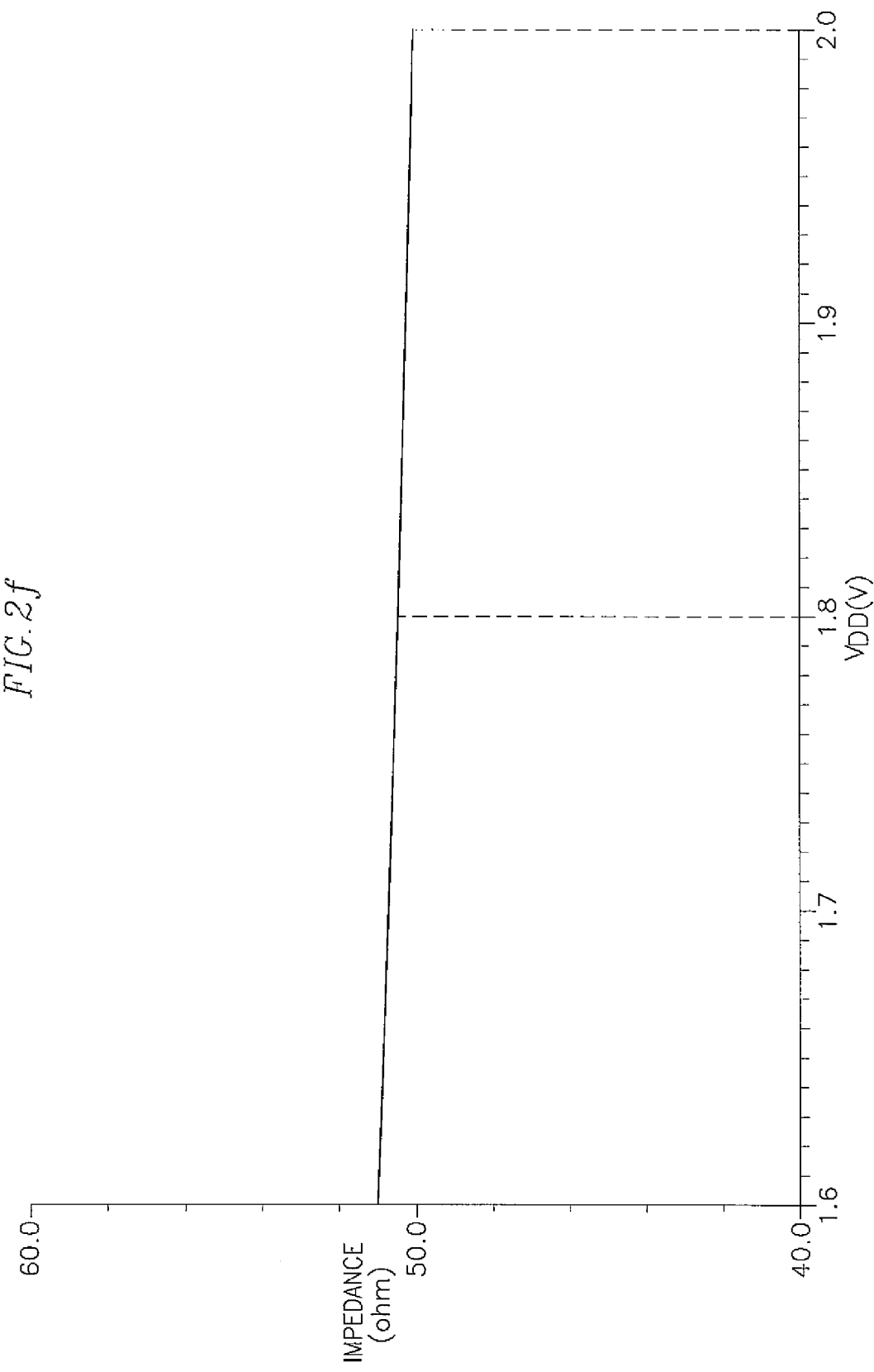

When combined with the constant impedances of the resistors 202 or 302, which will not tend to vary as the high voltage $V_{DD}$ varies, the overall impedance of the termination circuits 200 and 300 are similarly relatively less sensitive to changes in the high voltage $V_{DD}$. FIG. 2f illustrates variations in the overall impedance of the termination circuits 200 or 300 (e.g., the collective impedance of the resistor 202 and the transistor 208, or the collective impedance of the resistor 302 and the transistor 308) in relation to variations in the high voltage $V_{DD}$.

The termination circuit may operate at any impedance for a corresponding nominal high voltage value, based on the channel length of the transistor and the resistance of the resistor, according to the design and function of the termination circuit. For example, the termination circuit may be designed to have an impedance of approximately 50.5Ω at a nominal high voltage $V_{DD}$ of approximately 1.8 V, with the resistor having a resistance of 25Ω, and the transistor having an impedance of approximately 25.5Ω at the nominal high voltage $V_{DD}$ of approximately 1.8 V. As the high voltage $V_{DD}$ is reduced to 1.6 V, because the impedance of the transistor is relatively insensitive to changes in the high voltage $V_{DD}$, the impedance of the termination circuit may increase to approximately 51Ω. Similarly, as the high voltage $V_{DD}$ is increased to 2.0 V, the impedance of the termination circuit may be approximately 50.1Ω. Thus, the collective impedance of the termination circuit may only vary by +/−1% as the high voltage $V_{DD}$ varies between 1.6 V and 2.0 V.

Thus, as illustrated in FIGS. 2e and 2f, the impedance of the impedance components (e.g., the transistors 208 and 308) of the termination circuits 200 and 300 of FIGS. 2a-2d, is less sensitive to variations in the high voltage $V_{DD}$ when compared to the termination circuits 100 and 120 of FIGS. 1a-1b, because the gate-to-source voltage $V_{GS}$ is not directly a function of the high voltage $V_{DD}$. The lower sensitivity to changes in power supply voltages may provide more reliable impedance components and improve the performance of electronic devices or electrical circuitry such as data transmission lines utilized in display devices or flat panel displays, mobile communication devices (e.g., cellular telephones or smart phones), tablet computers, personal computers, digital cameras, media players, or other electronic devices that have a display panel or a memory core and utilize resistors with a relatively low sensitivity to power supply variations.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An impedance circuit coupled to a first power supply, the impedance circuit comprising:
   an output node;
   a transistor coupled between the output node and the first power supply, wherein the transistor comprises a gate electrode; and
   a voltage source electrically coupled to the gate electrode of the transistor and configured to apply a gate voltage to the gate electrode of the transistor, wherein the voltage source comprises:
      a plurality of impedance components electrically coupled in series between a circuit node and the first power supply, and
      a current source electrically coupled between the circuit node and a second power supply, wherein the circuit node is selectively electrically coupled to the gate electrode of the transistor in response to a control signal voltage.

2. The impedance circuit of claim 1, further comprising a resistor electrically coupled between the transistor and the output node.

3. The impedance circuit of claim 1, wherein the impedance components comprise a plurality of diode-connected transistors or a plurality of diodes.

4. The impedance circuit of claim 1, wherein the first power supply is configured to provide a first voltage and the second power supply is configured to provide a second voltage, wherein the first voltage is higher than the second voltage.

5. The impedance circuit of claim 1, wherein the first power supply is configured to provide a first voltage and the second power supply is configured to provide a second voltage, wherein the first voltage is lower than the second voltage.

6. The impedance circuit of claim 1, wherein the voltage source further comprises a multiplexer, the multiplexer comprising a high voltage terminal and a low voltage terminal electrically coupled between the circuit node and the first power supply, wherein the multiplexer is configured to selectively electrically couple the circuit node to the gate electrode of the transistor in response to the control signal voltage.

7. The impedance circuit of claim 1, wherein each of the impedance components is configured to have a uniform and constant voltage drop.

8. An impedance circuit comprising:
   a transistor comprising a gate electrode; and
   a voltage source electrically coupled to the gate electrode of the transistor and configured to apply a gate voltage to the gate electrode of the transistor, wherein the voltage source comprises:
      a plurality of impedance components electrically coupled in series to a circuit node, and
      a current source electrically coupled between the circuit node and a first power supply, wherein the circuit node is selectively electrically coupled to the gate electrode of the transistor in response to a control signal voltage.

9. The impedance circuit of claim 8, further comprising an output node, wherein the transistor is electrically coupled between the output node and a second power supply.

10. The impedance circuit of claim 9, further comprising a resistor electrically coupled between the transistor and the output node.

11. The impedance circuit of claim 9, wherein the first power supply is configured to provide a first voltage and the second power supply is configured to provide a second voltage, wherein the first voltage is higher than the second voltage.

12. The impedance circuit of claim 9, wherein the first power supply is configured to provide a first voltage and the second power supply is configured to provide a second voltage, wherein the first voltage is lower than the second voltage.

13. The impedance circuit of claim 9, wherein the voltage source further comprises a multiplexer, the multiplexer comprising a high voltage terminal and a low voltage terminal electrically coupled between the circuit node and the first power supply, wherein the multiplexer is configured to selectively electrically couple the circuit node to the gate electrode of the transistor in response to the control signal voltage.

14. The impedance circuit of claim 8, wherein the impedance components comprise a plurality of diode-connected transistors or a plurality of diodes.

15. The impedance circuit of claim 8, wherein each of the impedance components is configured to have a uniform and constant voltage drop.

16. A method of making an impedance circuit, the method comprising:
   electrically coupling a voltage source to a gate electrode of a transistor, wherein the voltage source comprises:
      a plurality of impedance components electrically coupled in series to a circuit node, and
      a current source electrically coupled between the circuit node and a first power supply; and
   selectively applying a gate voltage from the circuit node of the voltage source to the gate electrode of the transistor.

17. The method of claim 16, further comprising electrically coupling the transistor between an output node of the impedance circuit and a second power supply.

18. The method of claim 17, further comprising:
   providing a first voltage from the first power supply; and
   providing a second voltage from the second power supply, wherein the first voltage is higher than the second voltage.

19. The method of claim 17, further comprising:
   providing a first voltage from the first power supply; and
   providing a second voltage from the second power supply, wherein the first voltage is lower than the second voltage.

20. The method of claim 16, wherein the impedance components comprise a plurality of diode-connected transistors or a plurality of diodes.

* * * * *